(12) United States Patent
Wen et al.

(10) Patent No.: US 8,048,694 B2
(45) Date of Patent: Nov. 1, 2011

(54) PACKAGE BASE STRUCTURE AND ASSOCIATED MANUFACTURING METHOD

(75) Inventors: An-Nong Wen, Hsinchu (TW); Ching-Chi Cheng, Hsinchu (TW); Chih-Ming Chen, Hsinchu (TW)

(73) Assignee: Silicon Base Development Inc., Hsinchu (TW)

( * ) Notice: Subject to any disclaimer, the term of this patent is extended or adjusted under 35 U.S.C. 154(b) by 540 days.

(21) Appl. No.: 11/695,345

(22) Filed: Apr. 2, 2007

(65) Prior Publication Data

US 2007/0246724 A1    Oct. 25, 2007

(30) Foreign Application Priority Data

Apr. 21, 2006 (TW) .............................. 95114473 A

(51) Int. Cl.
*H01L 21/76* (2006.01)
(52) U.S. Cl. ................. 438/26; 257/98; 257/99
(58) Field of Classification Search .................. 257/98, 257/99, 81, E33.056, E33.057; 438/26, 29
See application file for complete search history.

(56) References Cited

U.S. PATENT DOCUMENTS

| | | | |
|---|---|---|---|
| 6,114,240 A * | 9/2000 | Akram et al. | 438/667 |
| 6,531,328 B1 | 3/2003 | Chen | |
| 6,816,301 B1 * | 11/2004 | Schiller | 359/290 |
| 2004/0076383 A1 | 4/2004 | Peng et al. | |
| 2006/0038195 A1 | 2/2006 | Pan et al. | |
| 2006/0138436 A1 | 6/2006 | Chen et al. | |
| 2006/0261357 A1 * | 11/2006 | Tsou et al. | 257/88 |
| 2007/0090510 A1 * | 4/2007 | Tseng et al. | 257/690 |
| 2008/0006837 A1 * | 1/2008 | Park et al. | 257/98 |

FOREIGN PATENT DOCUMENTS

| | | |
|---|---|---|
| JP | 2002353501 | 12/2002 |
| TW | 591261 | 6/2004 |

* cited by examiner

*Primary Examiner* — Stephen W Smoot
*Assistant Examiner* — Sonya McCall Shepard

(57) ABSTRACT

A package base structure of a light emitting device and associated manufacturing method is provided. The method includes steps of forming a first mask layer and a second mask layer on a first surface and a second surface of a substrate; defining a first opening and a second opening on the first mask layer and the second mask layer wherein the first opening is larger than the second opening; etching the substrate to form the package base structure having a holding space and at least two through holes. The upper opening of the holding space is located on the first surface of the substrate, and the bottom of the holding space can support the light emitting device. The lower openings of the through holes are located on the second surface of the substrate, and the tops of the through holes reach the bottom of the holding space. There is at least one slant structure at the contact between sidewalls of the through holes and the bottom of the holding space.

15 Claims, 9 Drawing Sheets

PACKAGE BASE STRUCTURE AND ASSOCIATED MANUFACTURING METHOD

FIELD OF THE INVENTION

The present invention relates to a package base structure of a light emitting device and the associated manufacturing method, and more particularly to a package base structure of a light emitting device having a through-hole structure capable of preventing formations of a base leakage current and a fault of the conductive layer and the associated manufacturing method.

BACKGROUND OF THE INVENTION

The Light Emitting Diode (LED) is a light emitting device. Similar to a diode, LED consists of a semiconductor material, and the doped and implanted impurities therein create a p-n junction. When voltage bias is applied across the p-n junction, the current flows from the p-side, the anode, to the n-side, the cathode, and the charge-carriers, electrons and electron holes flow into the junction from the anode and cathode, respectively, and meets each other. Then the electron falls into a lower energy level, and releases a photon, that is lighting. The LEDs have benefits in their low operating voltages, small power consumptions, high-efficiency light emitting, extreme short emitting response time, pure light color, firm structures, anti-impact, anti-vibration, stable and reliable performances, light and small bodies, and low cost, etc. The development in LEDs is prompt, and it is now capable of manufacturing high-illuminant and high-performance LEDs for emitting light of all colors in the visible light spectrum in mass production. The LED manufacturing process includes the upstream processes for manufacturing the epitaxial layers of the LEDs, while the middle-stream processes includes the chip design and wafer dicing process, and the downstream processes includes the packaging and testing of the LEDs. The quality of the final LEDs product is greatly depending on the package technology. The conventional packaging of the LEDs includes two types: the circuit type and the lead-frame type. The circuit-board type process uses circuit boards made of composite material as substrates to be compression molded so as to package the LEDs. In the lead-frame type process, a metallic lead frame is used as the substrate, and the packaging is performed by injection molding or compression molding. However, the LEDs produced by this two packaging methods have common defects such as deficient heat resistances and poor heat dissipations, etc.

Therefore, a process for forming a LED packaging substrate is developed and disclosed in U.S. Pat. No. 6,531,328. The steps for this method are illustrated in FIGS. 1A-1G. Firstly, as shown in FIG. 1A, a silicon substrate 1 with (100)-oriented lattice structure is provided. Then, as indicated in FIG. 1B, a photoresist 10 is applied on one side of the silicon substrate 1. A photolithography process is then executed so that the photoresist in area 11 (see FIG. 1C) is removed. FIG. 1D indicates that etched grooves 12 are formed by wet etching the substrate 1. Each of the etched grooves 12 has an inclined wall with an inclined angle of 54.74°. In FIG. 1E, the photoresist 10 is removed. After then, another photoresist is applied on the other side of the silicon substrate. The photoresist is then exposed and developed to define a semi-through hole and a through-hole pattern in respective aligned relationship with the etched groove 12. The semi-through hole pattern and the through-hole pattern are then dry-etched to form the semi-through hole 14 and the electrode holes 15 through the silicon substrate. After removing the photoresist from the silicon wafer substrate, the structure of the substrate 1 made by silicon is shown in FIG. 1F. The final steps include forming an insulation layer 16 on the front and back sides of the substrate 1 by oxidation or nitridation; and applying a conductive metal layer 17 by electroplating to the front and back sides of substrate 1 and inside electrode holes 15. The LED packaging substrate, as shown in FIG. 1G, is then formed.

However, in the process of manufacturing the above-mentioned conventional LED packaging substrate structure, wet/dry etchings are needed to etch the front/back side of the silicon substrate. Therefore, the process needs complex steps to perform the manufacturing of the packaging substrate, which also increases the cost. Furthermore, many of the products manufactured by the above-mentioned method cannot conduct current normally. That is because an unpredictable fault phenomenon may happen when applying the conductive layer 17 on the electrode hole 15, which will reduce the yield of the packaging of the LED grain on the substrate 1. Furthermore, when welding the packaged LED to the printed circuit board, some solder may overflows from the rear side 19 of the silicon substrate 1 to the lateral side 18, which will cause an leakage current. Therefore, the above-mentioned defects are intended to be improved by the present invention.

SUMMARY OF THE INVENTION

Therefore, the present invention provides a method of manufacturing a packaging base for a light emitting device, including steps of: providing a substrate having a first surface and a second surface; forming a first mask layer and a second mask layer on the first surface and the second surface respectively; forming a first opening and a second opening on the first mask layer and the second mask layer respectively; wherein the first opening is larger than the second opening; etching said substrate for forming a holding space on said first opening and at least one through hole on said second opening, wherein the top of said at least one through hole is connected to the bottom of said holding space to form a junction having a sharp edge; and continuously executing the etching on the substrate for removing the sharp edge of the junction to form at least one inclined surface.

In an embodiment, the substrate is a silicon substrate having (100)-oriented lattice, and a first included angle between a bottom portion and a sidewall of the holding space is 54.74 degrees or 45 degrees.

In an embodiment, the etching is a wet etching and the wet etching is executed in an etching solution having a concentration between 20-35 weight percent and a temperature between 80-90° C., wherein the etching solution is a KOH solution or a TMAH solution.

In an embodiment, the etching is a dry etching and the dry etching is executed in a deep reactive ion etching method using SF6 or CF4 etching gas.

In an embodiment, the first opening and the second opening are formed by steps of: forming the first mask layer and the second mask layer above the first surface and the second surface respectively, wherein the first and second mask layers are composed by silicon nitride, silicon oxide, metal, or photoresist; defining a first pattern and a second pattern via a first mask and a second mask respectively; and forming the first opening and the second opening by etching the first and second mask layers according to the first pattern and the second pattern.

In an embodiment, the method further includes steps of: forming a first silicon oxide insulating layer on the first and second surfaces of the substrate after the wet etching; forming a reflection layer on the first silicon oxide insulating layer;

forming a second silicon oxide insulating layer on the reflection layer; and forming a conductive layer on the second silicon oxide insulating layer and the first silicon oxide insulating layer.

In an embodiment, the first oxide insulating layer is formed by a high temperature oxidation method.

In an embodiment, the reflection layer is formed by evaporating or sputtering.

In an embodiment, the first silicon oxide layer is formed by a method selected from PECVD, a low-temperature-normal-pressure CVD and low-temperature-low-pressure tube-furnace deposition.

In an embodiment, the conductive layer is made of an alloy selected from TiW/Cu/Ni/Au, Ti/Cu/Ni/Au, Ti/Au/Ni/Au and AlCu/Ni/Au.

In an embodiment, the conductive layer is formed by steps of: defining a first electroplating area and a second electroplating area on the second silicon oxide insulating layer and a portion of the first silicon oxide insulating layer located on the second surface respectively via a third mask and a fourth mask; and forming the conductive layer on the first electroplating area and the second electroplating area by sputtering-and-electroplating or sputtering-and-chemical-plating.

In an embodiment, the second surface includes a solder stop structure formed by steps of: defining a third opening on the second mask layer formed on the second surface of the substrate; and wet-etching the substrate to form the solder stop structure on the third opening.

In an embodiment, the solder stop structure is an inclined surface or an area having a plurality of ragged structures.

In an embodiment, the light emitting device is a LED or a laser diode.

The present invention also relates to a packaging base applied on a light emitting device which includes: a substrate having a first surface and a second surface; a holding space having a top opening located on the first surface and a bottom for holding thereon the light emitting device; a through hole having a sidewall and a bottom opening located on the second surface so that a junction is formed between the sidewall and the bottom of the holding space; and at least one inclined surface formed on the junction of the sidewall of the through hole and the bottom of the holding space.

In an embodiment, the substrate is a silicon substrate having (100)-oriented lattice, and a first included angle between a bottom portion and a sidewall of the holding space is 54.74 degrees or 45 degrees.

In an embodiment, a solder stop structure is formed around an edge of the second surface.

In an embodiment, the packaging base further includes: a first silicon oxide insulating layer formed on the first surface and the second surface of the substrate; a reflection layer forming on a portion of the first silicon oxide insulating layer located on the first surface; a second silicon oxide insulating layer formed on the reflection layer; and a conductive layer formed on the second silicon oxide insulating layer and a portion of the first silicon oxide insulating layer located on the second surface.

In an embodiment, the packaging base further includes an adhesive layer formed above a portion of the conductive layer located on the first surface.

In an embodiment, the light emitting device is a LED or a laser diode.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
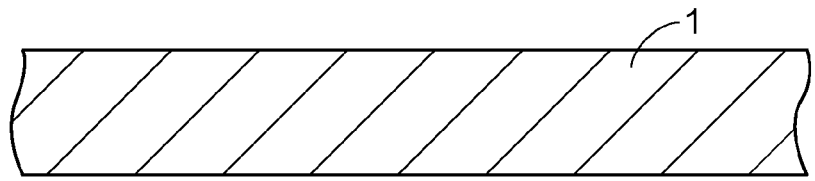
FIGS. 1A-1G illustrate a flow of the method for manufacturing a conventional package base of a LED.
Figure 1B:
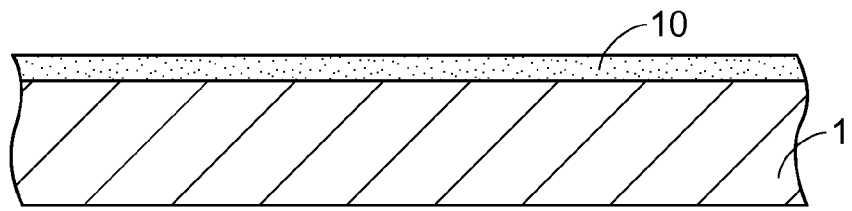
Figure 1C:
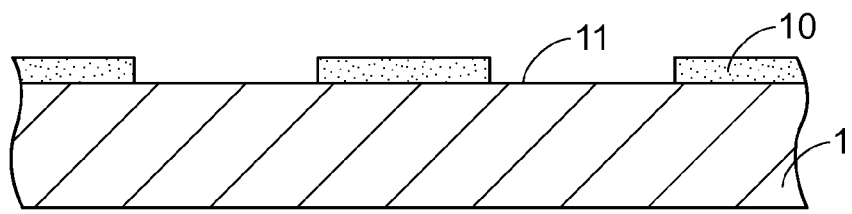
Figure 1D:
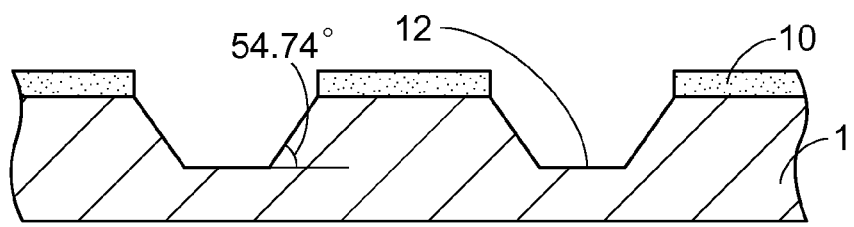
Figure 1E:
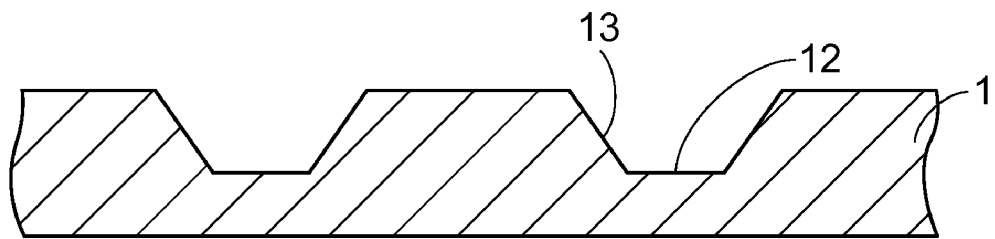
Figure 1F:
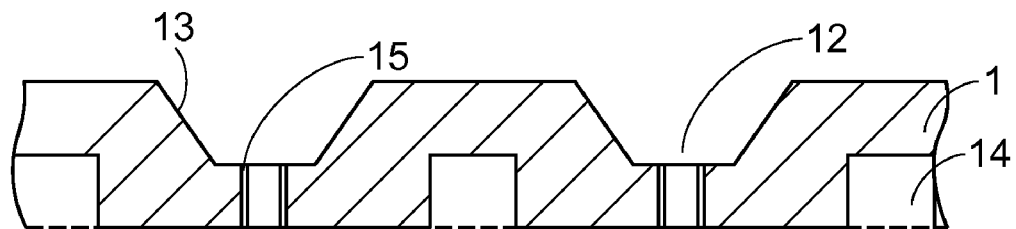
Figure 1G:
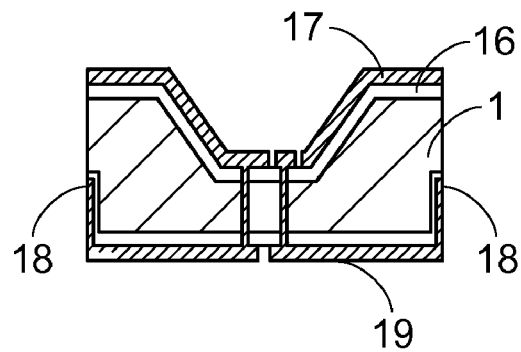
Figure 2:
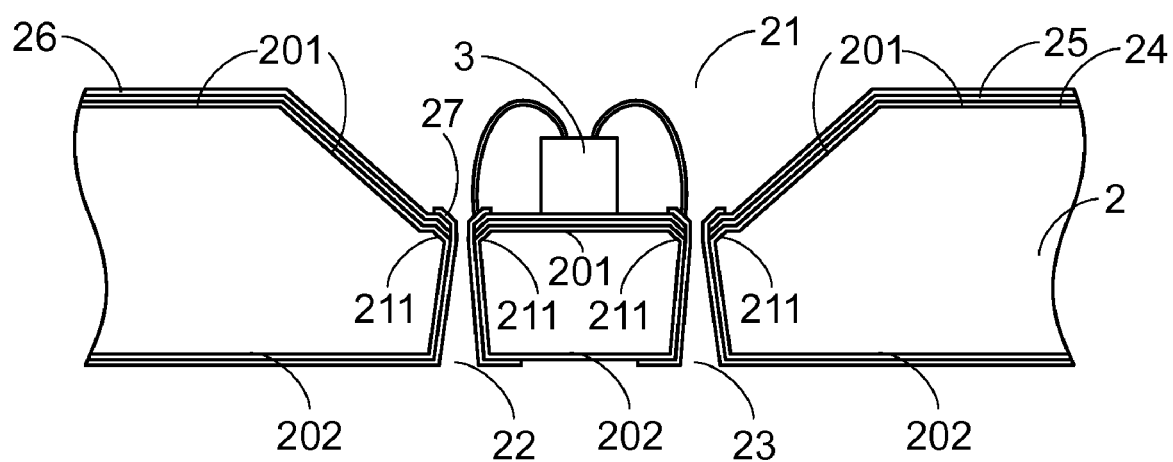
FIG. 2 is a perspective view illustrates a preferred embodiment of the package base structure according to the invention.

An embodiment of the packaging structure of the invention is shown in FIG. 2. Such a structure can be applied on the packaging of a light emitting device, such as a LED or a laser diode. The packing structure includes a silicon substrate 2 having a first surface 201 and a second surface 202, a holding space 21, and through holes 22 and 23. The silicon substrate 2 is a high resistance silicon substrate with (100)-oriented lattice structure. The top opening of the holding space 21 is located on the side of the first surface 201. The bottom of the holding space 21 is capable of carrying the light emitting device 3 which may be a LED or a laser diode. The bottom openings of the through holes 22 and 23 are located on the side the same as that of the second surface 202, while the top openings of the through holes 22 and 23 are located at the bottom of the holding space 21. The key feature of the packaging structure of the invention is that there is at least an inclined surface 211 formed between junctions of the lateral walls of the through holes 22 and 23 and the bottom of the holding space 21.

Figure 3A:
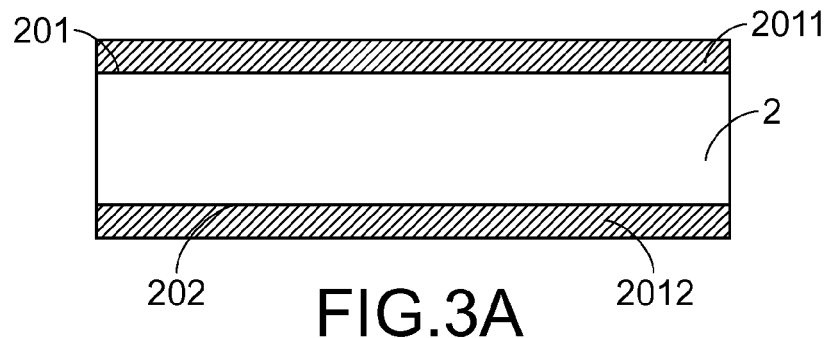
FIGS. 3A-3I illustrate a flow of the method for manufacturing the LED package base structure.
Figure 3B:
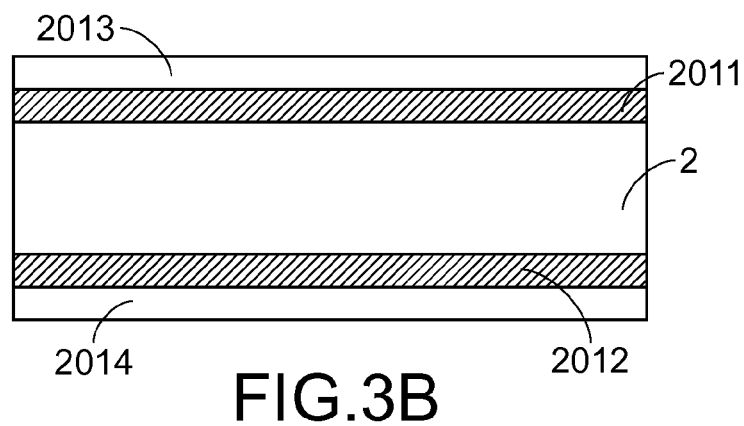

FIGS. 3A-3I illustrates the steps for manufacturing an embodiment of the package base structure of invention. Please refer to FIG. 3A, mask layers 2011, 2012 composed by silicon nitride, silicon oxide or metal are respectively formed on the first and second surfaces 201 and 202 of the silicon substrate 2. Then, as shown in FIG. 3B, a first photoresist layer 2013 and a second photoresist layer 2014 are formed above the mask layers 2011 and 2012 respectively.

Figure 3C:
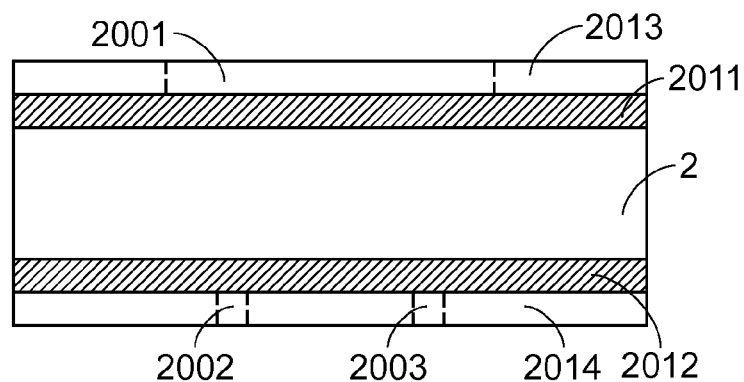
Figure 3D:
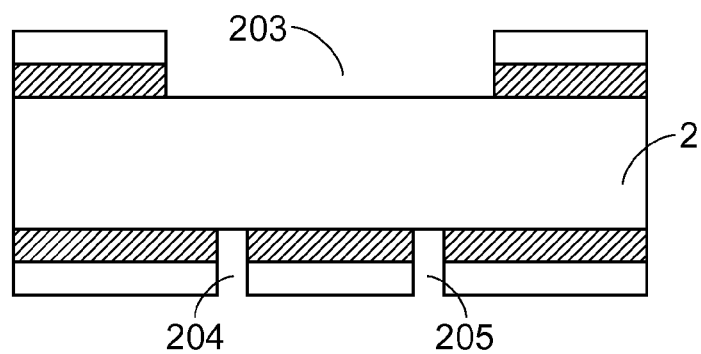
Figure 3E:
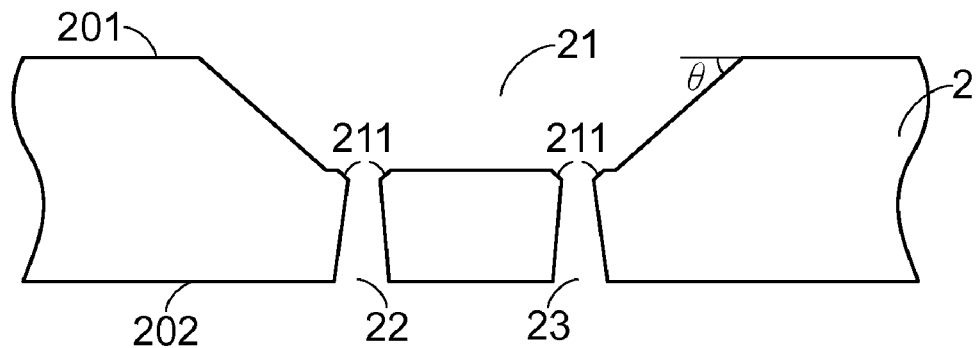
Figure 3F:
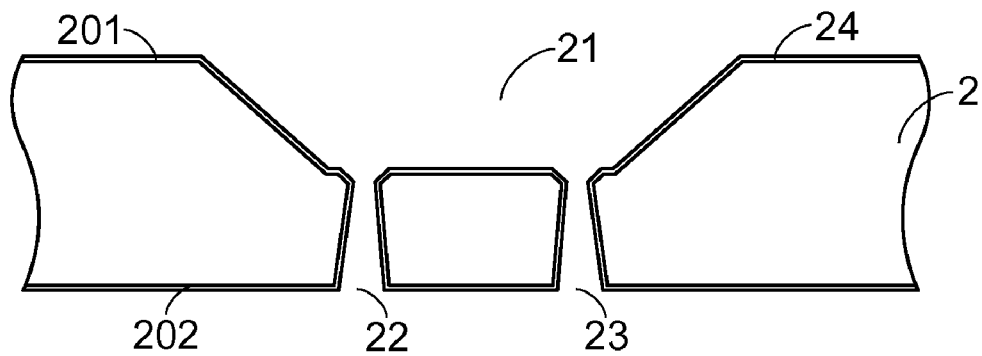
Figure 3G:
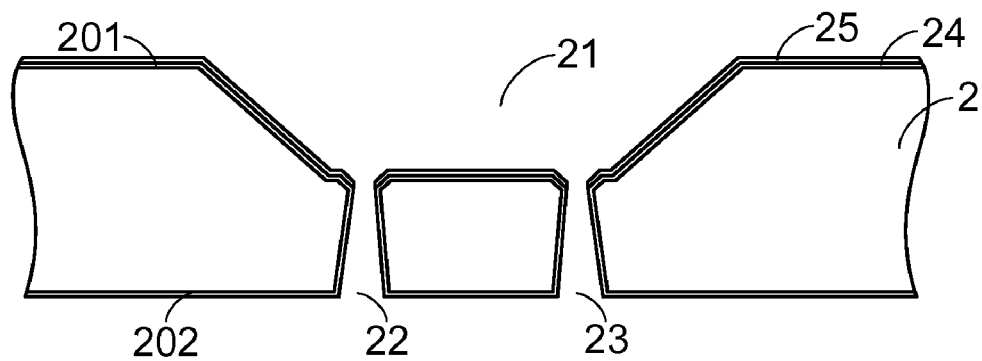
Figure 3H:
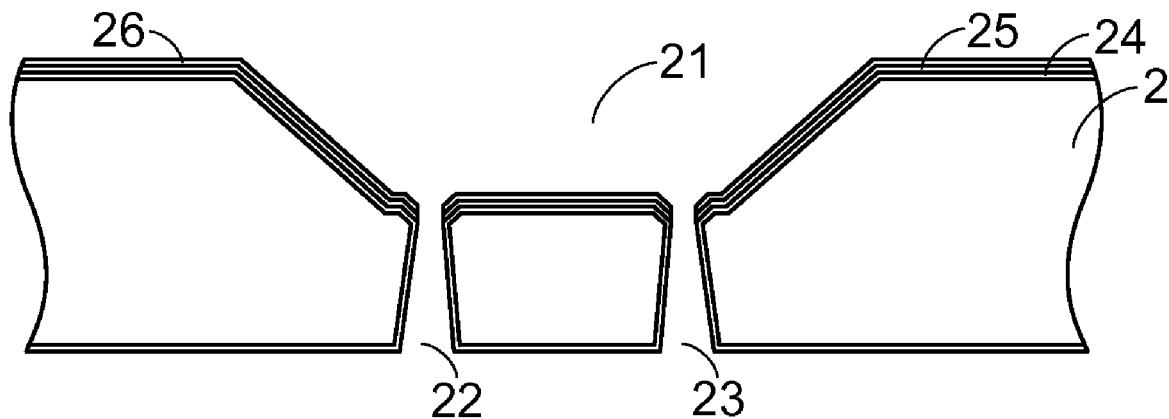
Figure 3I:
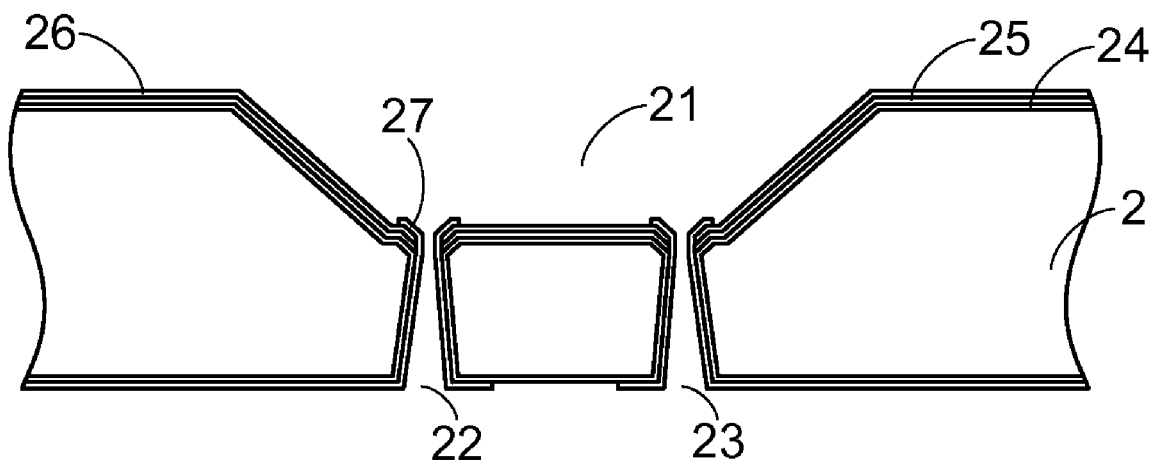

FIG. 3C illustrates that the pattern 2001 of the holding space 21 and the patterns 2002 and 2003 of the through holes 22 and 23 are defined via a first mask and a second mask (not shown) respectively. An etching process is followed according to the patterns 2001, 2002, and 2003 to form the openings 203, 204, and 205, as shown in FIG. 3D. Then, as shown in FIG. 3E, a wet etching is executed to form the holding space 21 on the opening 203, and through holes 22 and 23 on the openings 204 and 205, respectively. Meanwhile, the inclined surfaces 211 are formed on the junctions of the side walls of the through holes 22 and 23 and the bottom of the holding space 21. In FIG. 3F, a first silicon oxide insulating layer 24 is formed on the first surface 201 (including the surface of the holding space 21), and the second surface 202 (including the side walls of the through holes 22 and 23). FIG. 3G illustrates that a reflection layer 25 is formed above the first silicon oxide insulating layer 24. The material of the reflection layer 25 could be aluminum or silver, both of which have high reflectivity. In FIG. 3H, a second silicon oxide insulating layer 26 is formed above the reflecting layer 25. Finally, as shown in FIG. 3I, a conducting layer 27 is formed and thus the LED packaging substrate structure shown in FIG. 2 is obtained. The conducting layer 27 covers the second silicon oxide layer 26 and the first silicon oxide layer 24 (including the portion of the first silicon oxide layer 24 covering the sidewalls of the through holes 22 and 23). The metal layer 27 is made of alloys such as TiW/Cu/Ni/Au, Ti/Cu/Ni/Au, Ti/Au/Ni/Au, or AlCu/Ni/Au. The following descriptions will disclose further details of the procedures of the invention.

Commonly speaking, the wet etching for forming the holding space 21 and the through holes 22 and 23 is executed on the first surface 201 and the second surface 202. Accordingly, the holding space 21, the through holes 22 and 23, and the inclined surfaces 211 are formed on the substrate 2. A 20-35 weight % potassium hydroxide (KOH) or tetramethyl ammonium hydroxide (TMAH) solution having a temperature ranged between 80-95° C. is used for executing the wet etching process. In such a solution, the etching process will be executed according to the crystal lattice characters of the substrate 2. Alternatively, a dry etching also can be executed in a deep reactive ion etching method using SF6 or CF4 etching gas. As a result, the holding space 21, the through holes 22 and 23, and the inclined surfaces 211 are formed by removing the sharp edge of the junctions between the bottom of the holding space 21 and the side walls of the through holes 22 and 23. According to the crystal lattice characters of the substrate 2, the included angle θ between the bottom and sidewall of the holding space 21 is 54.74 degrees or 45 degrees.

The above-mentioned first silicon oxide insulating layer 24 is formed by a thermal oxidation method. The reflection layer 25 is formed above the first silicon oxide insulating layer 24 by evaporating or sputtering. The second silicon oxide insulating layer 26 is formed on the reflection layer 25 by a plasma enhanced chemical vapor deposition (PECVD), a low-temperature-normal-pressure chemical vapor deposition (CVD), or a low-temperature-low-pressure tube-furnace deposition. A third mask and a fourth mask (not shown) are used for defining a first electroplating area and a second electroplating area which cover the surface of the through holes on the second silicon oxide insulating layer 26 and the first silicon oxide insulating layer 24. The conductivity layer 27 is thus formed by applying a sputtering-and-electroplating method or a sputtering-and-electroless-plating method, e.g. a sputtering-and-chemical-plating method, on the first and second electroplating areas.

Figure 4A:
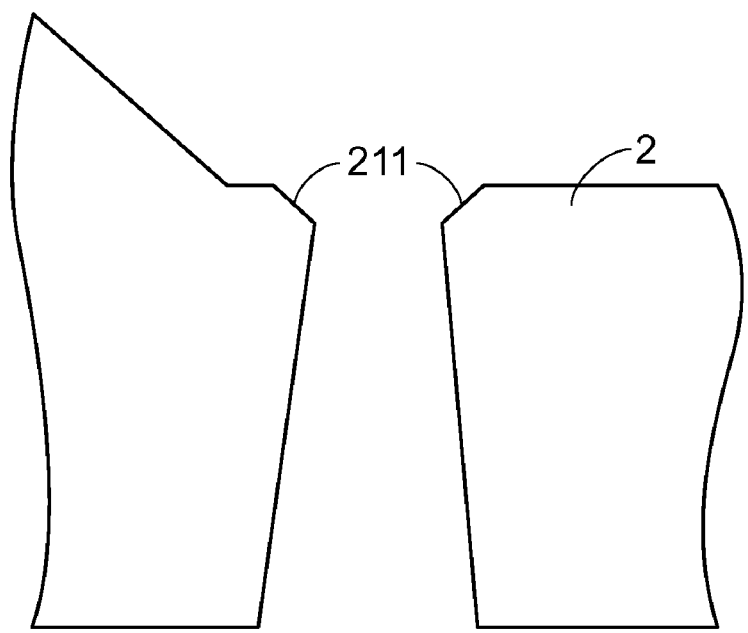
FIGS. 4A and 4B illustrate an embodiment of the inclined surface located on the junction between the bottom of the holding space and the sidewalls of the through holes according to the invention.
Figure 4B:
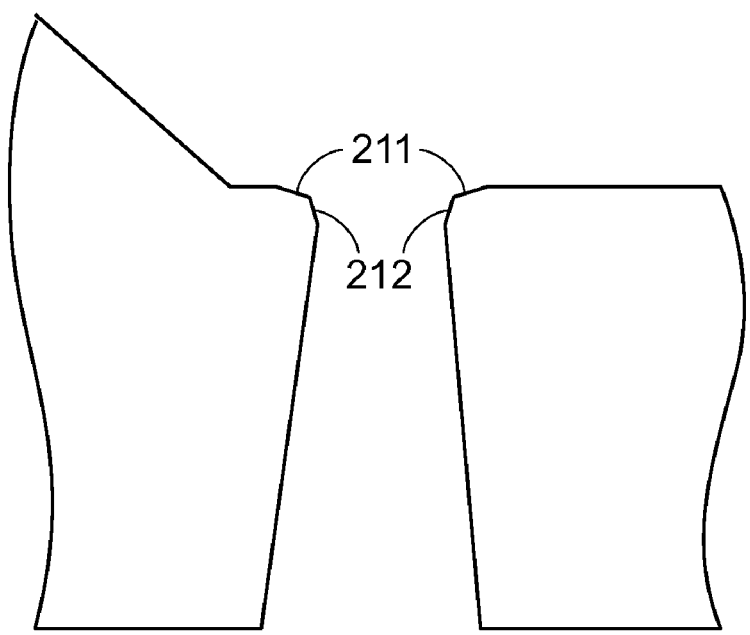

It can be observed obviously from the above-mentioned descriptions that a very important feature of the invention is that a wet etching process is used for etching both the first surface 201 and the second surface 202 of the silicon substrate 2 (which is a (100)—oriented silicon substrate with high resistance) simultaneously. The etching solution is a KOH or a TMAH solution with a concentration of 20-35 weight percent and a temperature ranged between 80-95° C. With such a solution, the holding space 21, the through holes 22 and 23, and the inclined surfaces 211 formed by removing the sharp edges of the junctions between the bottom of the holding space 21 and the side walls of the through holes 22 and 23 are thus obtained. As shown in FIG. 4A, with the formation of the inclined surfaces 211, the junctions between the bottom of the holding space 21 and the sidewalls of the through holes 22 and 23 become smoother. Hence, while electroplating the conductive layer 27 on the sidewalls of the through holes 22 and 23, the fault will no more be formed since the sharp edge of the junctions between the bottom of the holding space 21 and the sidewalls of the through holes 22 and 23 have been removed. Except to form one inclined surface 211 on one junction of the silicon substrate 2, it is possible to form two inclined surfaces 211 and 212 on one junction, as shown in FIG. 4B.

Figure 5A:
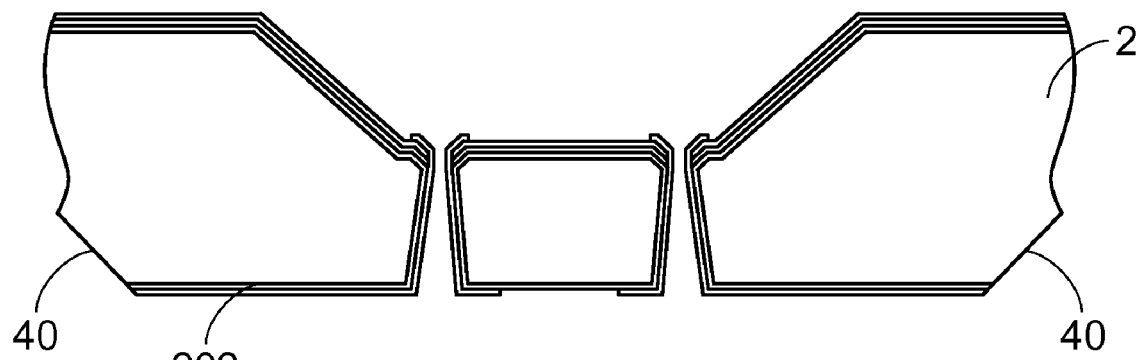
FIGS. 5A and 5B indicate an embodiment of a cross-sectional view of a solder stop structure for the LED package base according to the invention.
Figure 5B:
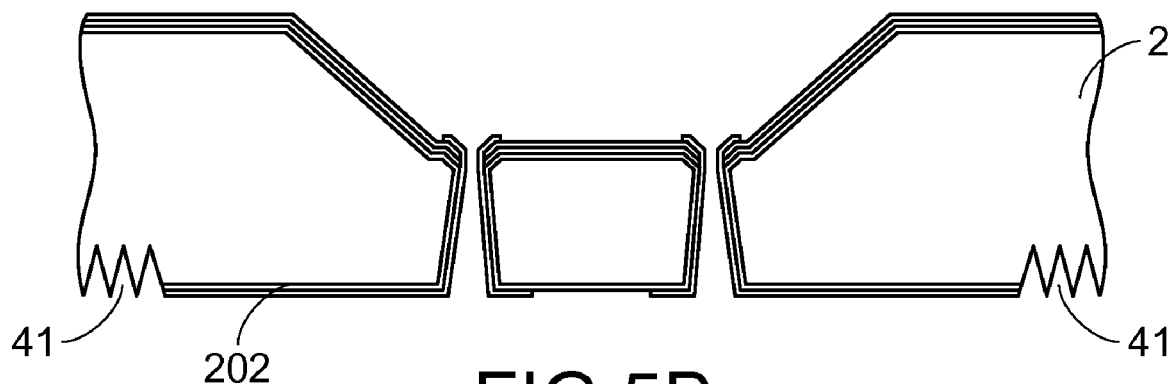

Except for the above-mentioned feature, if the silicon substrate 2 is a cheaper and common silicon substrate instead of the high-resistant silicon substrate mentioned above, it is needed to form a solder stop structure around the second surface 202 on the silicon substrate 2. As shown in FIGS. 5A and 5B, the solder stop structure may be inclined surfaces 40 as shown in FIG. 5A, or areas 41 shown in FIG. 5B with a plurality of ragged structures. During the soldering procedure to connect the packaging base to a printed circuit board (not shown), the solder exceeded from the second surface will be stopped by the solder stop structure (i.e. inclined surfaces 40 or areas 41). Consequently, the situation that the solder exceeding to the lateral side of the substrate 2 which may cause an unwanted increasing of the leakage current can be avoid. The above-mentioned solder stop structures are formed by the wet etching or the dry etching. Such stop structures are not needed for a high resistance silicon substrate. That is because the high resistance silicon substrate has a resistance value greater than 1000 Ohm, and thus the leakage current will not be increased to cause a problem after soldering the LED packaging base to the printed circuit board.

Figure 6:
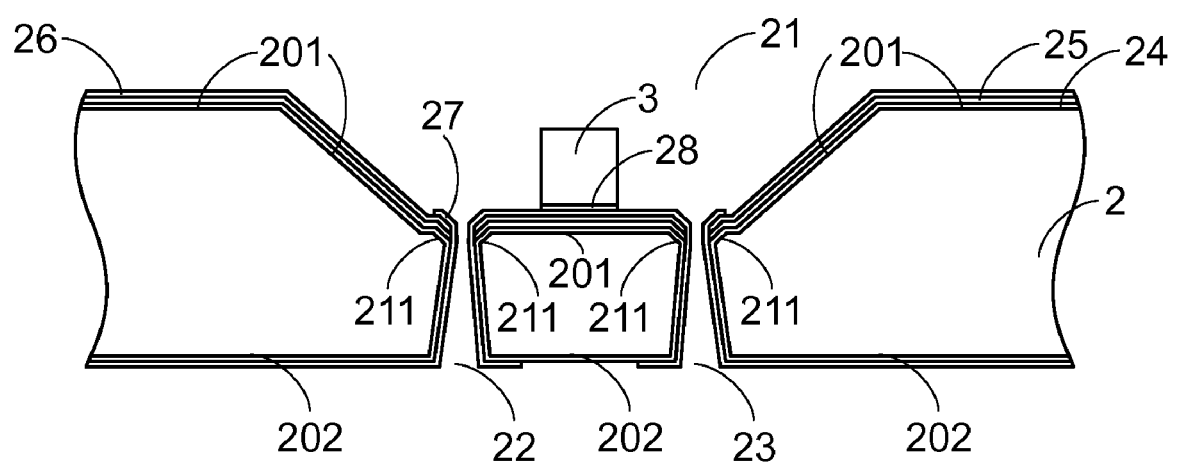
FIG. 6 illustrates an embodiment of the product of a LED packaged on the packaging base according to the invention by a flip chip process.

FIG. 6 illustrates a product of a LED 3 packaged on the packaging base (i.e. the silicon substrate 2) of the invention by a flip chip process. The light emitting device 3 (preferably an LED) can be conducted to the conductive layer 27 of the silicon substrate 2 by wire bonding, as shown in FIG. 2. The other way to conduct the light emitting device 3 and the silicon substrate 2 is, as shown in FIG. 6, to form an adhesive layer 28 formed by Al/Ti/AuSn alloy or Ti/Au/AuSn alloy, wherein AuSn is composed by 80% Au and 20% Sn or 75% Au and 25% Sn. The entire packaging process will be finished by forming the adhesive layer 28 to conduct the LED 3 and the conductive layer 28. Such a packaging performed by the flip chip process can not only reduce the area of the silicon substrate 2 since it is no need to bond wires, but also increase the heat transfer efficiency.

To sum up, the key feature of the LED packaging substrate is that during the whole process, the first and second surfaces of the substrate are wet etched by an etching solution (KOH or TMAH). The preferred concentration and temperature ranges of the etching solution are 20-35 weight percent and 80-95° C., respectively. After the wet etching, not only the necessary holding space and through holes are formed, but also at least an inclined surface is formed on the junctions between the bottom of the holding space and the side walls of the through holes. Such a feature will prevent the above-mentioned problems caused by faults of the conductive layer. Furthermore, since the first and second faces of the invention are able to be wet etched simultaneously, the process of the invention is thus simpler than the conventional ones, and the cost is reduced. Moreover, when a cheaper silicon substrate with low resistance is applied, a solder stop structured can be formed on the bottom of the silicon substrate, i.e. the side of the substrate facing the printed circuit board. The solder stop structure can prevent the exceeding of the solder and thus preventing the increasing of the leakage current. Consequently, the LED packaging base of the invention effectively resolves the defects of the prior art, and the hole structure of the LED packaging base enables a yield increasing of the product.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of manufacturing a base for a light emitting device, comprising steps of:
   providing a substrate having a first surface and a second surface;
   forming a first mask layer and a second mask layer on said first surface and said second surface respectively;
   forming a first opening and a second opening on said first mask layer and said second mask layer respectively; wherein said first opening is larger than said second opening;
   executing an etching on said substrate under a specified condition for forming a holding space on said first opening and at least one through hole on said second opening, wherein the top of said at least one through hole is connected to the bottom of said holding space to form a junction having a sharp edge; and
   continuously executing said etching on said substrate under said specified condition so as to remove said sharp edge of said junction to form at least one inclined surface which is configured to exhibit a function of preventing a fault of a conductive layer to be applied onto said substrate subsequently,
   wherein said second surface includes a solder stop structure formed by steps of:
   defining a third opening on said second mask layer formed on said second surface of said substrate; and
   etching said substrate under a specified condition on said third opening so as to remove a part of material of said substrate to form said solder stop structure.

2. A method according to claim 1 wherein said substrate is a silicon substrate having (100)-oriented lattice, and a first included angle between a bottom portion and a sidewall of said holding space is 54.74 degrees or 45 degrees.

3. A method according to claim 1 wherein said etching is a dry etching or a wet etching.

4. A method according to claim 1, wherein said first opening and said second opening are formed by steps of:
   forming said first mask layer and said second mask layer above said first surface and said second surface respectively, wherein said first and second mask layers are composed by silicon nitride, silicon oxide, metal, or photoresist;
   defining a first pattern and a second pattern via a first mask and a second mask respectively; and
   forming said first opening and said second opening by etching said first and second mask layers according to said first pattern and said second pattern.

5. A method according to claim 1, comprising steps of:
   forming a first silicon oxide insulating layer on said first and second surfaces of said substrate after said wet etching;
   forming a reflection layer on said first silicon oxide insulating layer;
   forming a second silicon oxide insulating layer on said reflection layer; and
   forming said conductive layer on said second silicon oxide insulating layer and said first silicon oxide insulating layer.

6. A method according to claim 1 wherein said solder stop structure is an inclined surface.

7. A method according to claim 1 wherein said light emitting device is a LED or a laser diode.

8. A method according to claim 1 wherein said solder stop structure is an area having a plurality of ragged structures.

9. A method according to claim 3 wherein said wet etching is executed in an etching solution having a concentration between 20-35 weight percent and a temperature between 80-90° C., wherein said etching solution is a KOH solution or a TMAH solution.

10. A method according to claim 3 wherein said dry etching is executed in a deep reactive ion etching method using SF6 or CF4 etching gas.

11. A method according to claim 5 wherein said first oxide insulating layer is formed by a thermal oxidation method.

12. A method according to claim 5 wherein said reflection layer is formed by evaporating or sputtering.

13. A method according to claim 5 wherein said first silicon oxide layer is formed by a method selected from PECVD, low-temperature/normal-pressure CVD and a low-temperature-low-pressure tube-furnace deposition.

14. A method according to claim 5 wherein said conductive layer is made of an alloy selected from TiW/Cu/Ni/Au, Ti/Cu/Ni/Au, Ti/Au/Ni/Au, and AlCu/Ni/Au.

15. A method according to claim 5 wherein said conductive layer is formed by steps of:
   defining a first electroplating area and a second electroplating area on said second silicon oxide insulating layer and a portion of said first silicon oxide insulating layer located on said second surface respectively via a third mask and a fourth mask; and
   forming said conductive layer on said first electroplating area and said second electroplating area by sputtering-and-electroplating or sputtering-and-chemical-plating.

* * * * *